US009960727B2

(12) United States Patent
Park et al.

(10) Patent No.: US 9,960,727 B2
(45) Date of Patent: May 1, 2018

(54) STALL DIAGNOSIS APPARATUS FOR MOTOR OF AIR CONDITIONING ACTUATOR

(71) Applicants: HYUNDAI MOTOR COMPANY, Seoul (KR); KIA MOTORS CORPORATION, Seoul (KR)

(72) Inventors: June Kyu Park, Hwaseong-si (KR); Dong Ho Kwon, Seoul (KR); Soon Myung Kwon, Hwaseong-si (KR); Jin Kim, Suwon-si (KR); Yong Chul Kim, Hwaseong-si (KR); Gee Young Shin, Suwon-si (KR)

(73) Assignees: HYUNDAI MOTOR COMPANY, Seoul (KR); KIA MOTORS CORPORATION, Seoul (KR)

( * ) Notice: Subject to any disclaimer, the term of this patent is extended or adjusted under 35 U.S.C. 154(b) by 173 days.

(21) Appl. No.: 14/931,819

(22) Filed: Nov. 3, 2015

(65) Prior Publication Data
US 2016/0164449 A1      Jun. 9, 2016

(30) Foreign Application Priority Data
Dec. 4, 2014    (KR) .......................... 10-2014-0172887

(51) Int. Cl.
*H02P 29/02* (2016.01)
*B60H 1/00* (2006.01)
(Continued)

(52) U.S. Cl.
CPC ....... *H02P 29/021* (2013.01); *B60H 1/00857* (2013.01); *H02P 29/024* (2013.01);
(Continued)

(58) Field of Classification Search
CPC ...... G01R 31/343; G01R 31/42; G01R 31/34; H02K 11/001; G07C 3/00
(Continued)

(56) References Cited

U.S. PATENT DOCUMENTS

| 7,005,821 | B2* | 2/2006 | Sunaga | ............... B60H 1/00857 |
| | | | | 165/202 |
| 2002/0109473 | A1* | 8/2002 | Romanowich | ..... B60H 1/00835 |
| | | | | 318/434 |

(Continued)

FOREIGN PATENT DOCUMENTS

| KR | 10-2000-0071023 | 11/2000 |
| KR | 20-0310310 Y1 | 4/2003 |

(Continued)

*Primary Examiner* — Kawing Chan
*Assistant Examiner* — Bradley Brown
(74) *Attorney, Agent, or Firm* — McDermott Will & Emery LLP

(57) ABSTRACT

A stall diagnosis apparatus for a motor of an air conditioning actuator includes: a resistor connecting from a first door actuator of a Heating, Ventilation and Air Conditioning (HVAC) system of a vehicle to the ground; a resistor connection circuit connecting from a VCC power terminal to the resistor; a switch disposed on the resistor connection circuit; a first circuit and a second circuit branched from a motor connection circuit connecting from the VCC power terminal to a motor of the first door actuator through a motor driver and the resistor connection circuit, respectively; a current sensing circuit unit including an input terminal connected to the first circuit and the second circuit and outputting a current signal corresponding to a voltage value between the motor connection circuit and the resistor connection circuit; and a controller for controlling the motor and determining whether or not the motor is stalled.

11 Claims, 7 Drawing Sheets

(51) Int. Cl.
  *H02P 29/024* (2016.01)
  *G01R 31/34* (2006.01)
  *G01R 31/42* (2006.01)

(52) U.S. Cl.
  CPC ........ *B60H 1/00978* (2013.01); *G01R 31/343* (2013.01); *G01R 31/42* (2013.01)

(58) Field of Classification Search
  USPC ........................................................ 318/490
  See application file for complete search history.

(56) References Cited

U.S. PATENT DOCUMENTS

| | | | |
|---|---|---|---|
| 2003/0122517 A1* | 7/2003 | Lange | G05B 19/042 318/471 |
| 2016/0164449 A1* | 6/2016 | Park | B60H 1/00857 165/202 |

FOREIGN PATENT DOCUMENTS

| | | |
|---|---|---|
| KR | 10-2005-0000943 A | 1/2005 |
| KR | 10-2005-0029294 A | 3/2005 |
| KR | 10-2005-0061669 A | 6/2005 |
| KR | 20-0397378 Y1 | 10/2005 |
| KR | 10-0828838 B1 | 5/2008 |
| KR | 20-0459626 Y1 | 3/2012 |
| KR | 10-2012-0061439 A | 6/2012 |
| KR | 10-2012-0107280 A | 10/2012 |
| KR | 10-2014-0083352 A | 7/2014 |

\* cited by examiner

--PRIOR ART--

--PRIOR ART--

--PRIOR ART--

--PRIOR ART--

--PRIOR ART--

STALL DIAGNOSIS APPARATUS FOR MOTOR OF AIR CONDITIONING ACTUATOR

CROSS-REFERENCE TO RELATED APPLICATION

This application claims under 35 U.S.C. § 119(a) the benefit of Korean Patent Application No. 10-2014-0172887, filed on Dec. 4, 2014 with the Korean Intellectual Property Office, the entire contents of which are incorporated herein by reference.

TECHNICAL FIELD

The present disclosure relates to a stall diagnosis apparatus for a motor of an air conditioning actuator, and more particularly, to a stall diagnosis apparatus for a motor of an air conditioning actuator, which can quickly and efficiently diagnose in a short time whether or not motors of actuators used in a Heating, Ventilation and Air Conditioning (HVAC) system are stalled.

BACKGROUND

Vehicles are equipped with a Heating, Ventilation and Air Conditioning (HVAC) System for controlling indoor temperature and creating a pleasant indoor environment.

Recently, a Full Automatic Temperature Control (FATC) system is being applied to most vehicles in order to maintain a pleasant environment by automatically controlling the indoor temperature in accordance with the temperature set by a driver or a passenger.

In the FATC system, when a user sets the temperature, an air conditioning controller receives detection signals of sensors such as a solar radiation sensor for detecting the solar radiation, an external temperature sensor for detecting the external temperature and an in-vehicle temperature sensor for detecting the indoor temperature, and calculates the thermal load of the indoor based on the detected values of each sensor in order to control the indoor temperature. In consideration of the air conditioning load corresponding thereto, the discharge mode, the discharge temperature, the discharge direction, and the discharge air volume are determined.

Furthermore, in order to control the indoor temperature and the system operation, the air conditioning controller receives detected values of a discharge temperature sensor for detecting the discharge temperature, a heater temperature sensor for detecting the temperature of an electric heater (e.g., PTC heater; used as an auxiliary heater in case of internal combustion engine, and used as a main heater in case of electric vehicle), and an evaporator temperature sensor for detecting the temperature of an evaporator, and controls the operation elements such as an indoor/outdoor air door (intake door) actuator, a temperature control door (temp. door) actuator, a wind direction control door (mode door) actuator, a dehumidification (defog door) actuator, an air conditioning blower, a compressor, and an electric heater.

Meanwhile, in order to control the wind direction, temperature, and air volume in a vehicle, a plurality of doors such as an indoor/outdoor air door determining the inflow of indoor/outdoor air, a temperature control door (temp. door) determining the flow rate passing through a heater core and the flow rate bypassing the heater core, a wind direction control door (mode door) determining modes such as face, floor, mix, and bi-level, and a dehumidification door are installed in the HVAC system.

Also, as air conditioning actuators, door actuators for the opening/closing and movement of the doors are installed in each door. Basically, the door actuator includes a motor generating a torque.

More specifically, as shown in FIG. 1, a door actuator 10 includes a motor 11 equipped with a worm gear 12 on the shaft thereof, reduction gears 13 engaging with the worm gear 12 and delivering a reduced torque, an output gear 14 engaging with the reduction gears 13 and outputting the torque, a feedback sensor 15 outputting a voltage generated by a variable resistor in accordance with the rotation of the output gear 14 to feedback the voltage to a controller (not shown), and a case 16 mounted with the foregoing components.

As prior art documents about the door actuator, there are Korean Utility Model Nos. 20-1310310 (Mar. 31, 2003), 20-0397378 (Sep. 26, 2005), 20-0459626 (Mar. 28, 2012) and Korean Patent No. 10-0828838 (May 2, 2008).

A voltage signal outputted from the feedback sensor 15 is used as a feedback signal for controlling the location (location of motor) of the actuator 10. When a target location of the actuator corresponding to a desire location of the door is determined and a target feedback value (feedback voltage) according thereto is determined, the door actuator (motor) is controlled in a direction where the feedback value increases when the feedback value by the feedback sensor is smaller than the target feedback value, and the door actuator (motor) is controlled in a direction where the feedback value decreases when the feedback value by the feedback sensor is larger than the target feedback value.

FIGS. 2 and 3 are views illustrating a circuit connection state of a feedback sensor. The feedback voltage varied by a variable resistor 15a in accordance with the rotation (corresponding to the location of motor) of the output gear (not shown) upon normal/reverse rotation of a motor 11 is outputted from a feedback sensor 15.

Meanwhile, a technology of sensing the abnormality of the motor such as motor stall is being applied using a signal value (feedback value) of a feedback sensor in an air conditioning actuator.

An air conditioning controller (not shown) monitors the change of the feedback value that is a voltage value outputted from the feedback sensor, i.e., feedback value generated in accordance with the rotation location of the motor in a state where the driving of the motor is controlled in order to sensor the motor stall.

In this case, when there is no change for a certain time by measuring time from a time point where there is no change in the feedback value, the motor is determined as stalled.

However, there is a limitation in that time is spent to verify whether or not there occurs a change of the feedback value.

Accordingly, a method of recognizing the motor stall upon change of the current pattern by receiving a current value may be used in order to reduce the sensing time.

That is, as shown in FIG. 4, a shunt resistor 31 that is a resistor for current sensing is connected in series to the motor 11, and a current sensing circuit unit 32 capable of sensing a current flowing through the shunt resistor 31 is provided.

The current sensing circuit unit 32 is configured to output a current signal corresponding to voltages value at both ends of the shunt resistor 31. The air conditioning controller (not shown) receives the current signal from the current sensing circuit unit 32, and recognizes the motor stall when the current pattern changes.

FIG. 5 is a view illustrating a change of the current pattern generated upon motor stall in the method using the shunt resistor 31, which shows a current change section upon stall of the motor in addition to an initial operation current section and a normal operation current section upon operation of the motor.

Accordingly, the motor may be determined as stalled when a current of a reference level or more is sensed through the current sensing circuit unit 32.

However, a plurality of doors, such as an indoor/outdoor air door determining the inflow of indoor/outdoor air, an individual temperature control door (temp. door; driver's side and passenger's side) for controlling the respective seats, a wind direction control door (mode door) determining modes such as face, floor, mix, and bi-level, and a dehumidification door, are installed in the HVAC system.

Accordingly, since actuators for each door need to be provided in addition to actuators for rotating two doors together, it should be individually diagnosed and sensed whether or not each motor of actuators is stalled.

In this case, in the method of using a shunt resistor for each actuator, the shunt resistor for current sensing usually has a very small resistance value of several tens or hundreds of mΩ. In order to reduce a power loss due to the shunt resistor, it is advantageous that the shunt resistor has a small resistance value.

However, when the shunt resistor is installed for each motor, a power loss (including power loss due to the shunt resistors individually installed) of $I^2R$ occurs due to the current (I) and the resistance (R). Also, when the resistance values of the shunt resistors are different, an error may occur in measurement of the current value.

Particularly, since the motor driver 20 and the motor 11 are generally connected through wiring and the resistance component of the wire may reach several ohms (Ω) in accordance with the air conditioning actuator, a significant error may occur due to a large deviation (including a resistance deviation of the shunt resistor) in the method of measuring voltages at both ends of the shunt resistor.

Thus, it is very difficult to implement a logic for determining the motor stall from the voltages at both ends of the shut resistor by a controller. Also, since there is a limitation in that an error needs to be adjusted one by one for each vehicle model, it is actually impossible to apply to the controller.

Accordingly, even if a certain time is taken to sense the motor stall, the method of using a signal of the feedback sensor described above is being applied.

The above information disclosed in this Background section is only for enhancement of understanding of the background of the invention and therefore it may contain information that does not form the prior art that is already known in this country to a person of ordinary skill in the art.

SUMMARY OF THE DISCLOSURE

The present invention provides a stall diagnosis apparatus for a motor of an air conditioning actuator, which can quickly and efficiently diagnose in a short time whether or not motors of actuators used in a Heating, Ventilation and Air Conditioning (HVAC) system are stalled.

In one aspect, the present invention provides a stall diagnosis apparatus for a motor of an air conditioning actuator, the apparatus including: a resistor connecting from a first door actuator of a Heating, Ventilation and Air Conditioning (HVAC) system of a vehicle to the ground; a resistor connection circuit connecting from a VCC power terminal to the resistor; a switch disposed on the resistor connection circuit; a first circuit and a second circuit branched from a motor connection circuit connecting from the VCC power terminal to a motor of the first door actuator through a motor driver and the resistor connection circuit, respectively; a current sensing circuit unit including an input terminal connected to the first circuit and the second circuit and outputting a current signal corresponding to a voltage value between the motor connection circuit and the resistor connection circuit; and a controller for controlling the motor into a driving state, and in a switch-on state, comparing a current value of the current signal outputted from the current sensing circuit unit with a predetermined diagnosis current value in order to diagnose whether or not the motor is stalled.

In an exemplary embodiment, when the current value of the current signal outputted from the current sensing circuit unit is higher than the diagnosis current value, the controller may determine that the motor is stalled.

In another exemplary embodiment, in the HVAC system including a plurality of door actuators that are motor stall diagnosis targets in addition to the first door actuator: each door actuator except the first door actuator may include a resistor connection circuit connecting from the VCC power terminal to the resistor of the first door actuator; the resistor connection circuit of each door actuator may include a switch; each door actuator may include a first circuit and a second circuit branched from a motor connection circuit connecting and the resistor connection circuit which are connected to an input terminal of a current sensing circuit unit; and a controller may control one motor selected from each door actuator into a driving state, and in a switch-on state of the resistor connection circuit, may compare a current value of a current signal outputted from the current sensing circuit unit with a predetermined diagnosis current value in order to diagnose whether or not the motor is stalled.

In still another exemplary embodiment, when the current value of the current signal outputted from the current sensing circuit unit is higher than the predetermined diagnosis current value, the controller may determine that the motor is stalled.

In yet another exemplary embodiment, the current sensing circuit unit may be individually provided for the plurality of door actuators that are the motor stall diagnosis targets.

In still yet another exemplary embodiment, the diagnosis order of the plurality of door actuators that are the motor stall diagnosis targets may be set in the controller, and the controller may sequentially diagnose the plurality of door actuators in the set order.

In a further exemplary embodiment, the plurality of door actuators may be classified into high-load actuators requiring a relatively high torque and low-load actuators requiring a relatively low torque in the controller, and a high-load diagnosis current value for determining the motor stall of the high-load actuators and a low-load diagnosis current value for determining the motor stall of the low-load actuators may be set in the controller.

In another further exemplary embodiment, the controller may sequentially perform motor stall diagnosis in a predetermined order on one classification of the door actuators that are classified into high-load and low-load, and may change the diagnosis current value to sequentially perform the motor stall diagnosis on the other classification of the door actuators in a predetermined order.

In still another further exemplary embodiment, the door actuators classified into high-load may include a temperature control door actuator and an air volume control door actuator, and the door actuators classified into low-load may include an indoor/outdoor air door actuator and a dehumidification door actuator.

In yet another further exemplary embodiment, the door actuators classified into low-load may further include door actuators controlling air discharged into a console or a floor of rear seat of a vehicle.

In an exemplary embodiment, a stall diagnosis apparatus may include a first motor actuating a first door of a Heating, Ventilation and Air Conditioning (HVAC) system of a vehicle; a first motor driver connected between a VCC power terminal and the first motor, and driving the first motor by connecting the VCC power terminal to the first motor; a first switch and a resistor disposed parallel to the first motor driver and the first motor, wherein one terminal of the first switch is connected to the VCC power terminal and one terminal of the resistor is connected to the ground; a first current sensing circuit including a first input terminal connected between the first motor driver and the first motor and a second input terminal connected between the first switch and the resistor, and outputting a first current signal corresponding to a voltage differential between the first and second input terminals; and a controller, by transmitting a first driving signal to the first motor driver and a second driving signal to the first switch, controlling operation of the first motor and determining whether the first motor is stalled by determining whether a current value of the first current signal outputted from the first current sensing circuit is greater than a first predetermined diagnosis current value.

The stall diagnosis apparatus may further include a second motor actuating a second door of HVAC system; a second motor driver connected between the VCC power terminal and the second motor, and driving the second motor; a second switch connected in parallel to the first switch; and a second current sensing circuit including a third input terminal connected between the second motor driver and the second motor and a fourth input terminal connected between the second switch and the resistor, and outputting a second current signal corresponding to a voltage differential between the third and fourth input terminals. The controller, by transmitting a third driving signal to the second motor driver and a fourth driving signal to the second switch, may control operation of the second motor and determine whether the second motor is stalled by determining whether a current value of the second current signal outputted from the current sensing circuit is greater than a second predetermined diagnosis current value different from the first predetermined diagnosis current value.

Other aspects and exemplary embodiments of the invention are discussed infra.

BRIEF DESCRIPTION OF THE DRAWINGS

The above and other features of the present invention will now be described in detail with reference to certain exemplary embodiments thereof illustrated the accompanying drawings which are given hereinbelow by way of illustration only, and thus are not limitative of the present invention, and wherein.

Figure 1:
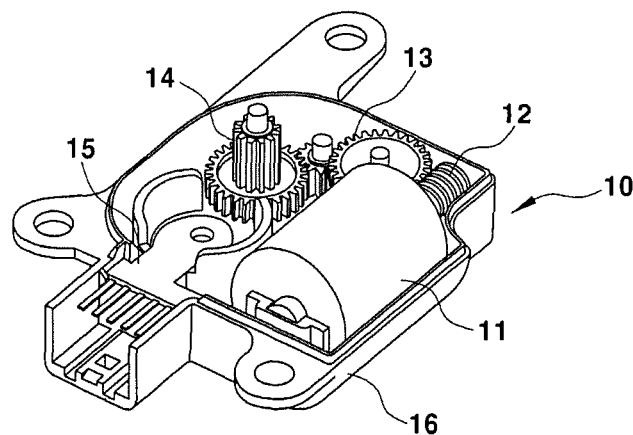
FIG. 1 is a view illustrating a door actuator.
Figure 2:
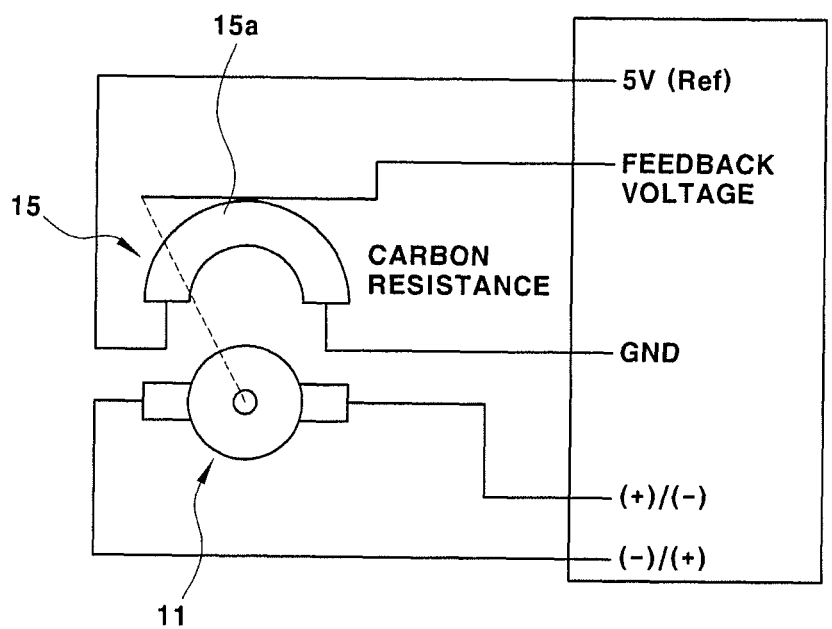
FIGS. 2 and 3 are view illustrating a circuit connection state of a feedback sensor.
Figure 3:
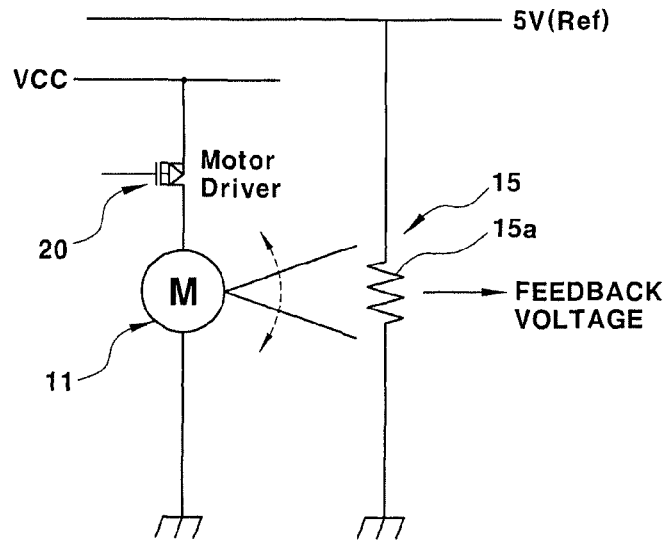
Figure 4:
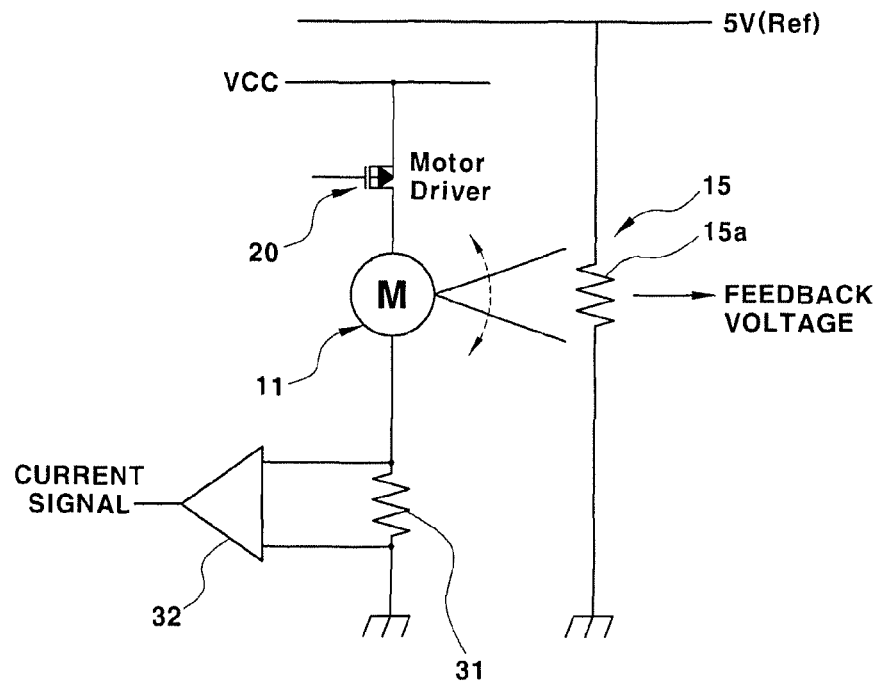
FIG. 4 is a view illustrating a motor stall diagnosis circuit using a shunt resistor.

It should be understood that the accompanying drawings are not necessarily to scale, presenting a somewhat simplified representation of various exemplary features illustrative of the basic principles of the invention. The specific design features of the present invention as disclosed herein, including, for example, specific dimensions, orientations, locations, and shapes will be determined in part by the particular intended application and use environment.

In the figures, reference numbers refer to the same or equivalent parts of the present invention throughout the several figures of the drawing.

DETAILED DESCRIPTION

Hereinafter reference will now be made in detail to various embodiments of the present invention, examples of which are illustrated in the accompanying drawings and described below. While the invention will be described in conjunction with exemplary embodiments, it will be understood that present description is not intended to limit the invention to those exemplary embodiments. On the contrary, the invention is intended to cover not only the exemplary embodiments, but also various alternatives, modifications, equivalents and other embodiments, which may be included within the spirit and scope of the invention as defined by the appended claims.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum). As referred to herein, a hybrid vehicle is a vehicle that has two or more sources of power, for example both gasoline-powered and electric-powered vehicles.

The above and other features of the invention are discussed infra.

Hereinafter, exemplary embodiments of the present invention will be described in detail with reference to the accompanying drawings so that those skilled in the art can easily carry out the present invention.

Figure 6:
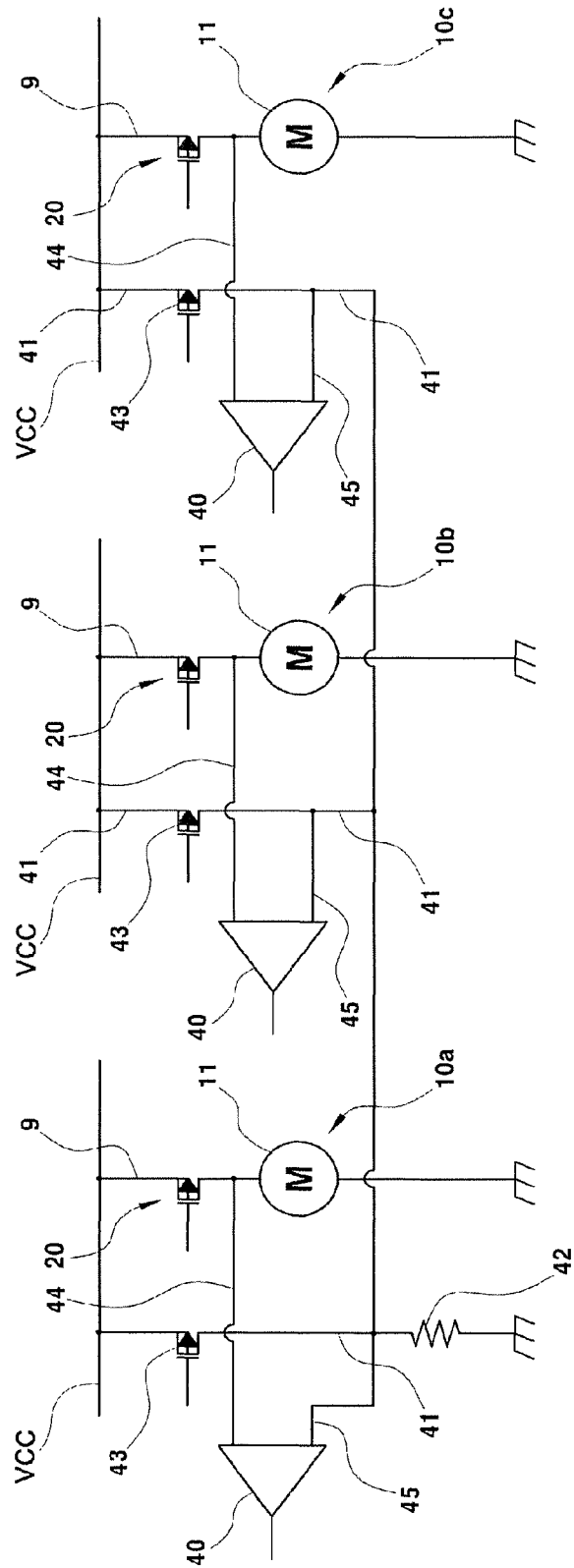
FIG. 6 is a view illustrating a motor stall diagnosis circuit of an air conditioning actuator according to an embodiment of the present invention.

FIG. 6 is a view illustrating a motor stall diagnosis circuit of an air conditioning actuator according to an embodiment of the present invention.

As shown in FIG. 6, as one air conditioning actuator in a Heating, Ventilation and Air Conditioning (HVAC) system, a first circuit 44 and a second circuit 45 may be branched from a motor connection circuit 9 connected from a VCC power terminal to a motor 11 through a motor driver 20 in a first door actuator 10*a* and a resistor connection circuit 41 connected from the VCC power terminal to a resistor 42 connected to the ground, respectively, and may be connected to the input terminal of a current sensing circuit unit 40.

Also, a switch 43 that is switched on/off by a controller (not shown; air conditioning controller) may be disposed on the resistor connection circuit 41 connected from the VCC power terminal to the resistor 42. In addition, the current sensing circuit unit 40 may be configured to output a current signal corresponding to a voltage value between the motor connection circuit 9 and the resistor connection circuit 41.

The controller may receive the current signal outputted by the current sensing circuit unit 40. When the controller receives the current signal of the current sensing circuit unit 40 in a state where the operation of the motor 11 is controlled and in a state where the switch 43 is switched on and senses a change of the current pattern, the first door actuator 10*a* may be recognized by the controller as a motor stall state.

The motor 11 may actuate a door of the HVAC system. The motor driver 20 may be connected between the VCC power terminal and the motor 11, and may drive the motor 11 by connecting the VCC power terminal to the motor 11 when a control signal from the controller (not shown) is applied to the motor driver 20. The switch 43 and the resistor 42 may be disposed parallel to the motor driver 20 and the motor 11. One terminal of the switch 43 may be connected to the VCC power terminal and one terminal of the resistor 42 may be connected to the ground. The current sensing circuit unit 40 may include a first input terminal connected between the motor driver 20 and the motor 11 and a second input terminal connected between the switch 43 and the resistor 42, and may output the current signal corresponding to a voltage between the first and second input terminals. The controller (not shown) may transmit a first driving signal to the motor driver 20 and a second driving signal to the switch 43, and thus, may control the operation of the motor 11 and determine whether the motor 11 is stalled by determining whether a current value of the current signal outputted from the current sensing circuit unit 40 is greater than a predetermined diagnosis current value.

Also, since the HVAC system includes a plurality of air conditioning actuators, i.e., door actuators including a motor, other actuators 10*b* and 10*c* like the first door actuator 10*a* may also include a motor connection circuit 9 with respect to the VCC power terminal, a resistor connection circuit 41 connected in parallel thereto, and a switch 43 disposed on the resistor connection circuit 41. Also, the resistor connection circuits 41 of each door actuator, equipped with the switch 43, may be connected to the resistor connection circuit 41 of the first door actuator 10*a*. In this case, the switches 43 of the other actuators 10*b* and 10*c* may be connected in parallel to the switch 43 of the first actuator 10*a*.

In this case, similarly to the first door actuator 10*a*, other door actuators 10*b* and 10*c* may include a first circuit 44 and a second circuit 45 branched from the motor connection circuit 9 and the resistor connection circuit 41, respectively. Also, the door actuators 10*b* and 10*c* may include a current sensing circuit unit 40, and each of the first circuits 44 and the second circuits 45 may be connected to the input terminals of the current sensing circuit units 40.

Also, similarly to the first door actuator 10*a*, the output terminal of the current sensing circuit unit 40 may be connected to the controller such that current signals outputted from the current sensing circuit units 40 of the door actuators 10*b* and 10*c* can be inputted into the controller.

Thus, the motor stall diagnosis circuit of all of the actuators 10*a*, 10*b* and 10*c* may use in common one grounding resistor (provided in a form of pull-down resistor) 42 connected in parallel to the motor 11 with respect to the VCC power terminal, and each current sensing circuit unit 40 may output a current signal corresponding to a voltage value between the motor connection circuit 9 and the resistor connection circuit 41 to the controller, allowing the controller to diagnose the motor stall of each actuator.

Figure 5:
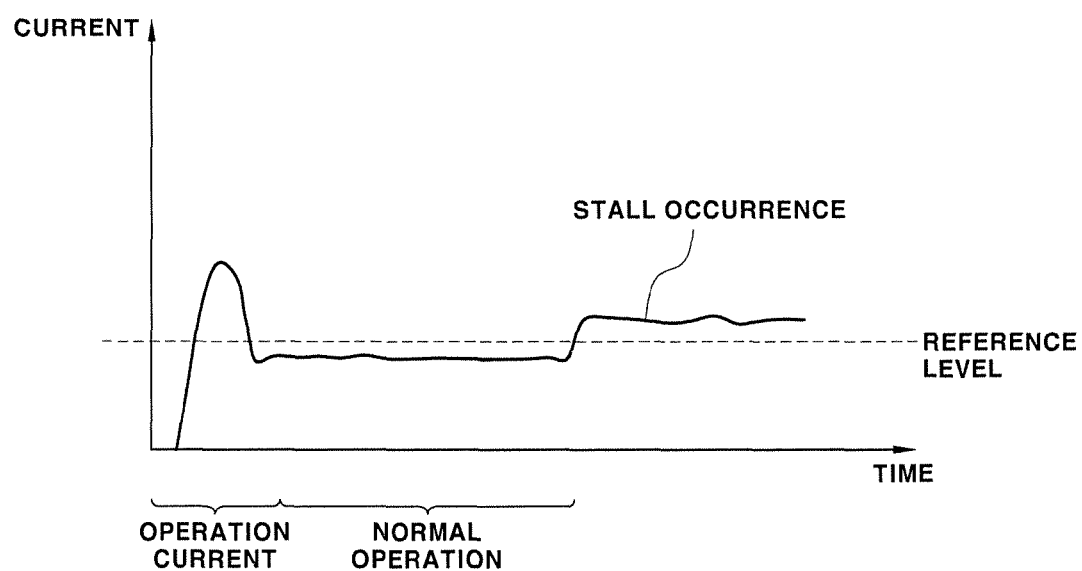
FIG. 5 is a view illustrating a current pattern change occurring upon motor stall in a method using a shunt resistor.
Figure 7:
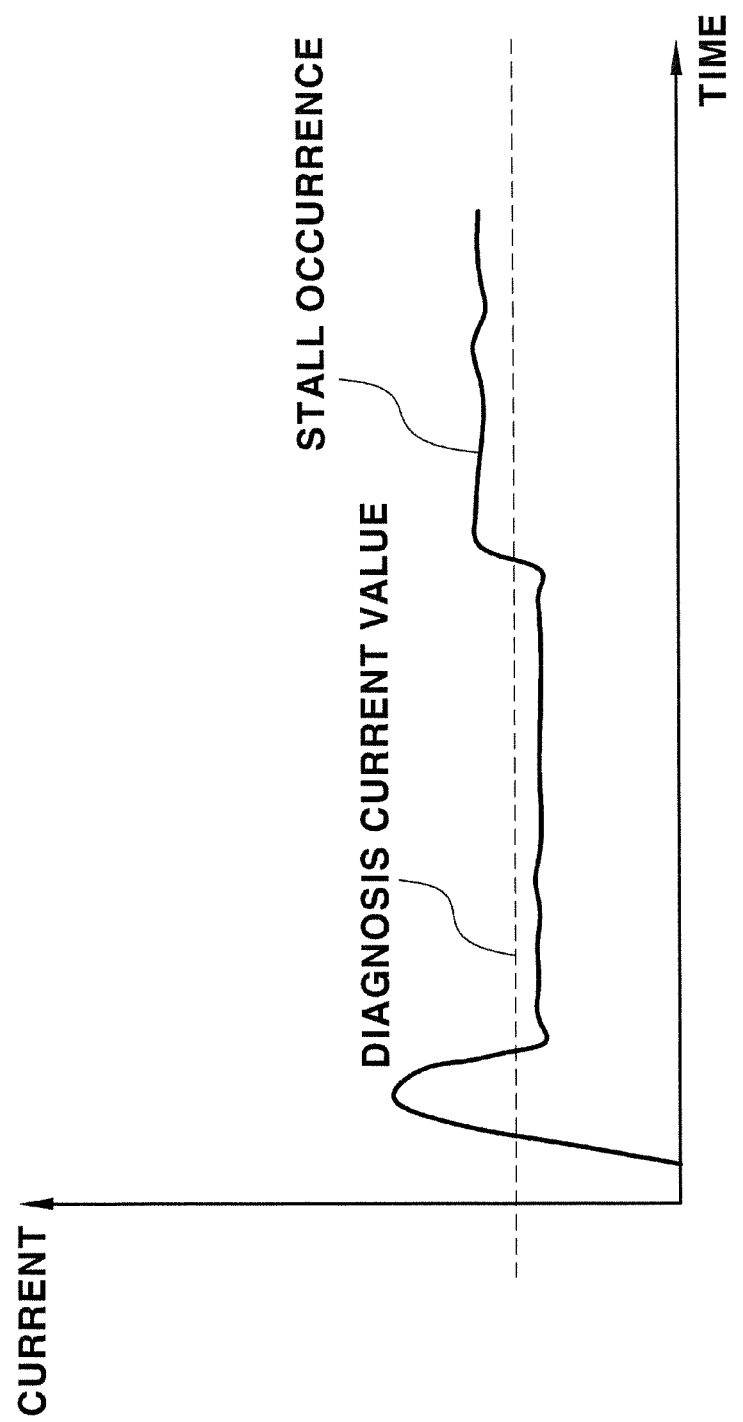
FIG. 7 is a view illustrating a current signal outputted from a current sensing circuit unit in a motor stall diagnosis circuit of an air conditioning actuator according to an embodiment of the present invention.

Meanwhile, the controller may sequentially perform the motor stall diagnosis process in accordance with the actuators. FIG. 7 is a view illustrating a current signal outputted from the current sensing circuit unit in the motor stall diagnosis circuit shown in FIG. 5.

As shown in FIG. 7, a diagnosis current value may be predetermined with respect to each actuator. A case where a current signal exceeding the diagnosis current value is inputted from the current sensing circuit unit may be determined as the motor stall by the controller.

Since the temperature control door (individually configured at driver's seat and passenger's seat) and the wind direction control door simultaneously rotating a plurality of doors have a large area and a large trajectory of rotational operation and are disposed at a location where a high pressure occurs, the temperature control door and the wind direction control door may be high-load doors requiring a relatively large torque. In case of a high-load motor embedded in these door actuators, the operation current and the motor stall occurrence current value may be higher than a low-load motor.

On the other hand, the indoor/outdoor air door for converting indoor/outdoor air, the dehumidification door, and the door for controlling air discharged into the console of rear seat or the floor of rear seat which is applied to some kinds of vehicles may be low-load doors requiring a relatively small torque. Generally, the motors of these door actuators may be allowed to output a small torque, and the operation current and the motor stall occurrence current value may be lower than a high-load motor.

Thus, the operation current and the current value of the motor stall occurrence section for each door actuator may differ in accordance with the use condition of low-load and high-load. Accordingly, the diagnosis current values for determining whether or not the motor stall occurs also need to differ.

Figure 8:
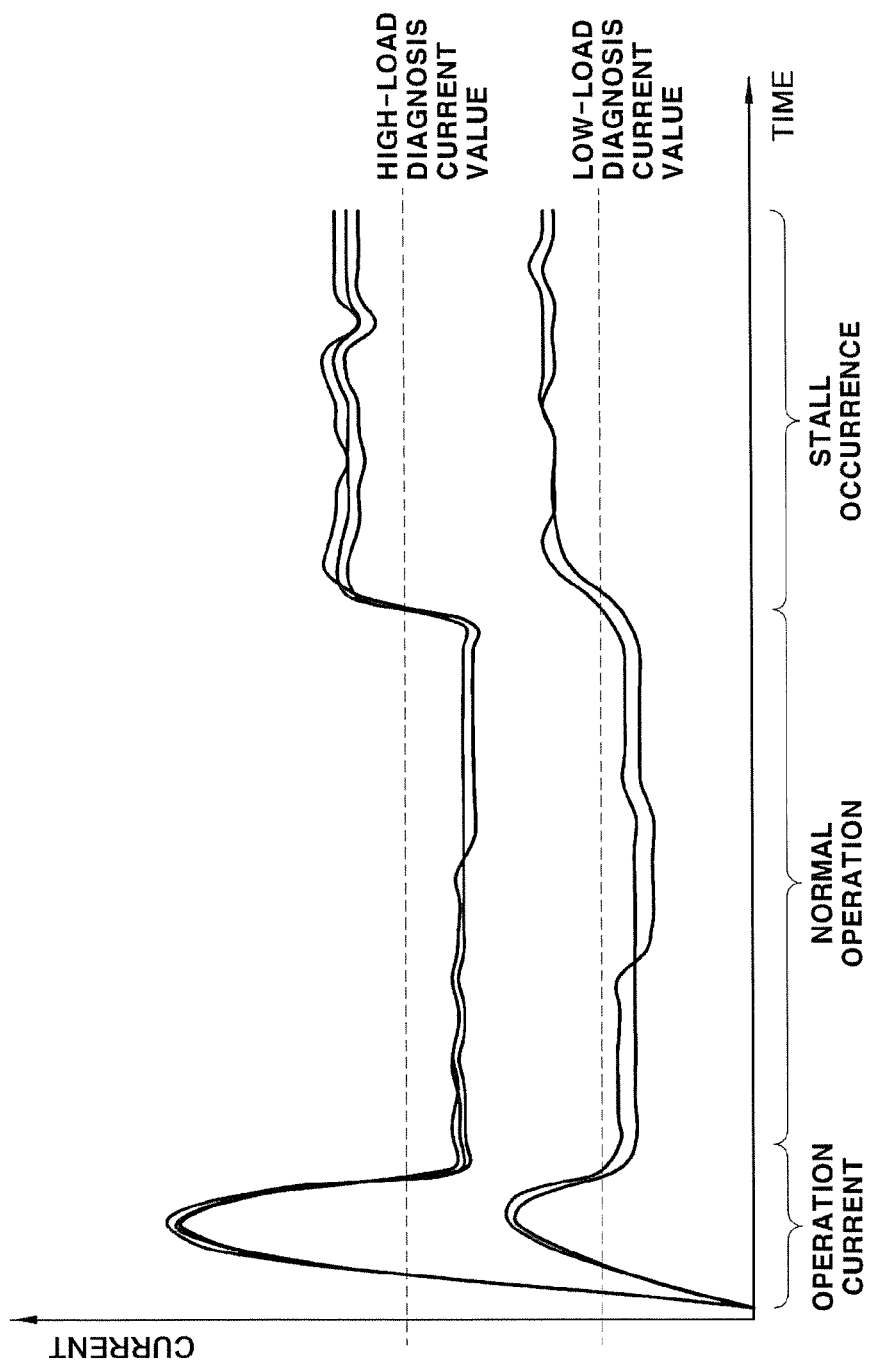
FIG. 8 is a view illustrating diagnosis current values set in an actuator for high-load and an actuator for low-load according to an embodiment of the present invention.

Accordingly, as shown in FIG. 8, the diagnosis current values may be separately set by differentiating between the actuator for high-load and the actuator for low-load, and may be used to determine whether or not the motor stall occurs.

That is, as described above, the motor of the actuator of the temperature control door and the motor of the actuator of the wind direction control door may be classified into high-load, and the motor of the actuator of the indoor/outdoor air door, the motor of the actuator of the dehumidification door, and the motor of the actuator of the door for controlling air discharged into the console and the floor of the rear seat. Thus, in case of high-load, the diagnosis current value may be set high, and in case of low-load, the diagnosis current value may be set low.

Also, since the motor stall diagnosis circuit is configured to use the resistor in common, sequential diagnosis needs to be performed to sense the motor stall of each door actuator.

Also, in configuring a compatible controller in various HVAC systems, when a plurality of motors need to be controlled and motors having different required torques (loads) are mixedly used, the diagnosis current value that is a determination criterion needs to be changed in order to sense the motor stall when the motor to be sensed is changed (high-load→low-load or low-load→high-load).

Accordingly, the determination order of the motor stall is preset, the motors of the door actuators for high-load and the motors of the door actuators for low-load may be classified in advance, and then whenever the motor to be sensed is changed, the diagnosis current value needs to be quickly changed. In order to overcome this limitation, the diagnosis current values may be separately set for high-load and low-load. For the high-load motors, the same diagnosis current value for high-load may be applied, and for the low-load motors, the same diagnosis current value for low-load may be applied.

In this case, the diagnosis may be performed using the same diagnosis current value corresponding to the motors of the same classification, and then the diagnosis may be performed using the same diagnosis current value corresponding to the motors of the other classification.

For example, the simultaneous diagnosis may be performed on the motors classified into high-load using the high-load diagnosis current value, and then the simultaneous diagnosis may be performed on the motors classified into low-load using the low-load diagnosis current value.

On the other hand, the simultaneous diagnosis may be performed on the motors classified into low-load, and then the simultaneous diagnosis may be performed on the motors classified into high-load.

Thus, when the simultaneous diagnosis is performed on the motors of one classification and then the diagnosis current value is changed to perform the simultaneous diagnosis on the motors of the other classification, the diagnosis current value may be changed for the diagnosis only when the classification is changed. Accordingly, more efficient diagnosis can be achieved.

Also, the determination order can be set for the motors in the same classification. For example, a prior order may be assigned to the actuator of the temperature control door which is subject to frequent location change and movement among the actuators pertaining to the high-load classification, allowing the motor stall of the actuator of the temperature control door to be preferentially diagnosed compared to other actuators.

Figure 9:
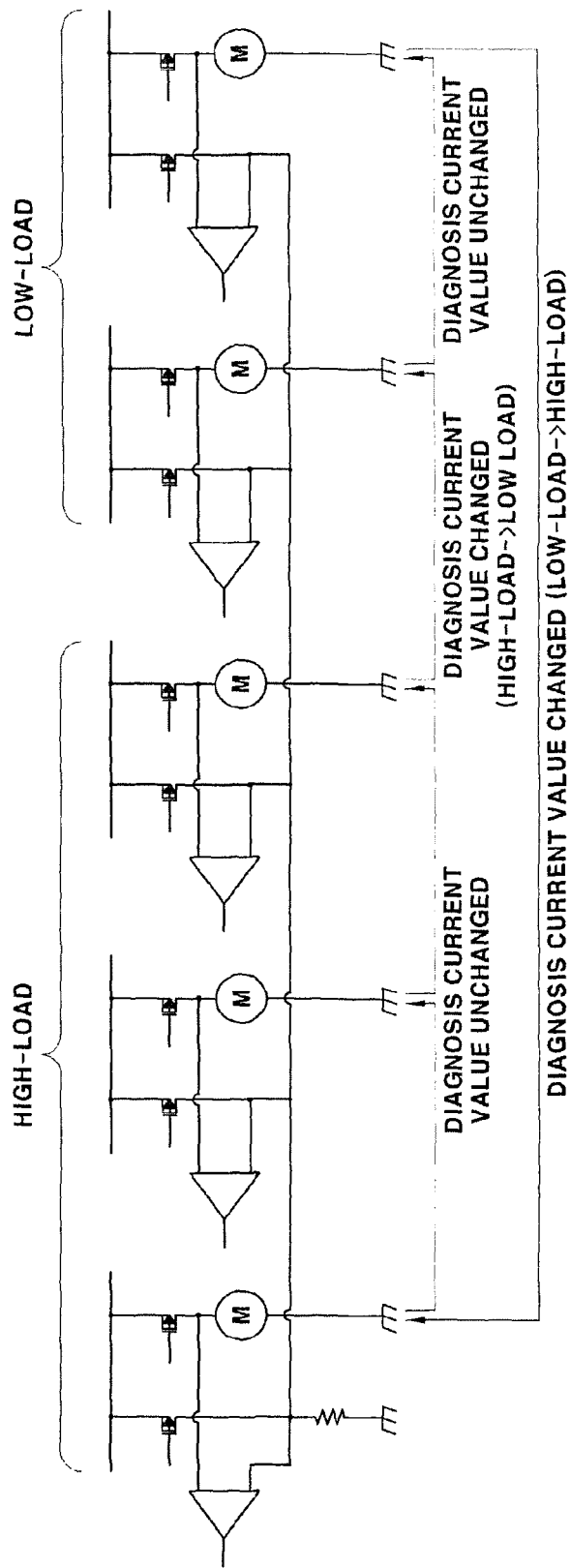
FIG. 9 is a view illustrating a diagnosis order setting state of motors classified into high-load and low-load according to an embodiment of the present invention.

FIG. 9 is a view illustrating a diagnosis order setting state of motors classified into high-load and low-load according to an embodiment of the present invention. It may be assumed that three motors at the left side are classified into high-load and two motors at the right side are classified into low-load in advance.

In this case, the diagnosis of the motor stall may be performed on all three left motors classified into high-load using the diagnosis current value for high-load without a change of the diagnosis current value.

That is, the diagnosis and determination of the motor stall may be sequentially performed in a predetermined order on the three motors classified into high-load. Current signals inputted from each current sensing circuit unit may be compared with the diagnosis current value for high-load. When the current value of the current signal is higher than the diagnosis current value for high-load, it may be determined that the stall of the corresponding motor occurs.

When the diagnosis is performed on a motor of a specific actuator, the switch installed on the resistor connection circuit of the corresponding actuator may be switched on, and simultaneously, the motor may be controlled into the driving state through the motor driver.

When the diagnosis, i.e., determination of whether or not the stall occurs on one motor is finished, the switch of the next actuator may be switched on, and simultaneously, the motor of the corresponding actuator may be controlled into the driving state, thereby performing the diagnosis of the motor stall.

Next, when the diagnosis of the motors classified into high-load is completed, the diagnosis current value may be changed from high-load into low-load, and then the diagnosis of the motor stall may be performed on the two right motors classified into low-load using the diagnosis current value for low-load.

Also, the diagnosis and determination of the motor stall may be sequentially performed in a predetermined order on the two motors classified into low-load. Current signals inputted from each current sensing circuit unit may be compared with the diagnosis current value for low-load which is changed from the diagnosis current value for high-load. When the current value of the current signal is higher than the diagnosis current value for low-load, it may be determined that the stall of the corresponding motor occurs.

Thereafter, when the diagnosis of the motor needs to be again performed on the motor classified into high-load, the controller may change from the diagnosis current value for low-load into the diagnosis current value for high-load, and then simultaneous stall diagnosis may be performed on motors classified into high-load.

Thus, a stall diagnosis apparatus for a motor of an air conditioning actuator according to an embodiment of the present invention has an effect of quickly and accurately diagnosing whether or not the motor is stalled, by including a resistor connected in parallel to a motor with respect to a VCC power supply so as to connect the resistor to the ground, including a current sensing circuit unit outputting a current signal corresponding to a voltage between a motor connection circuit and a resistor connection circuit, and allowing a controller to compare a current value of the current signal outputted from the current sensing circuit unit with a predetermined diagnosis current value so as to determine whether or not the motor is stalled.

Also, the resistor connection circuits disposed in the actuators to be diagnosed may be connected to one resistor so as to allow the respective motor stall diagnosis circuits of the actuators to use one resistor in common, and the controller may optimize and set the stall determination order with respect to the motors of the actuators, thereby enabling more efficient diagnosis.

The invention has been described in detail with reference to exemplary embodiments thereof. However, it will be appreciated by those skilled in the art that changes may be made in these embodiments without departing from the principles and spirit of the invention, the scope of which is defined in the appended claims and their equivalents.

What is claimed is:

1. A stall diagnosis apparatus for a motor of an air conditioning actuator, the apparatus comprising:
   a resistor connecting from a first door actuator of a Heating, Ventilation and Air Conditioning (HVAC) system of a vehicle to the ground;
   a resistor connection circuit connecting from a VCC power terminal to the resistor;
   a switch disposed on the resistor connection circuit;
   a first circuit and a second circuit branched from a motor connection circuit connecting from the VCC power terminal to a motor of the first door actuator through a motor driver and the resistor connection circuit, respectively;
a current sensing circuit unit comprising an input terminal connected to the first circuit and the second circuit and outputting a current signal corresponding to a voltage value between the motor connection circuit and the resistor connection circuit; and
a controller for controlling the motor into a driving state, and in a switch-on state, comparing a current value of the current signal outputted from the current sensing circuit unit with a predetermined diagnosis current value in order to diagnose whether or not the motor is stalled,
wherein, when the current value of the current signal outputted from the current sensing circuit unit is higher than the diagnosis current value, the controller determines that the motor is stalled, and
wherein in the HVAC system comprising a plurality of door actuators that are motor stall diagnosis targets in addition to the first door actuator:
each door actuator except the first door actuator comprises a resistor connection circuit connecting from the VCC power terminal to the resistor of the first door actuator;
the resistor connection circuit of each door actuator comprises a switch;
each door actuator comprises a first circuit and a second circuit branched from a motor connection circuit connecting and the resistor connection circuit which are connected to an input terminal of a current sensing circuit unit; and
a controller controls one motor selected from each door actuator into a driving state, and in a switch-on state of the resistor connection circuit, compares a current value of a current signal outputted from the current sensing circuit unit with a predetermined diagnosis current value in order to diagnose whether or not the motor is stalled.

2. The stall diagnosis apparatus of claim 1, wherein when the current value of the current signal outputted from the current sensing circuit unit is higher than the predetermined diagnosis current value, the controller determines that the motor is stalled.

3. The stall diagnosis apparatus of claim 1, wherein the current sensing circuit unit is individually provided for the plurality of door actuators that are the motor stall diagnosis targets.

4. The stall diagnosis apparatus of claim 1, wherein the diagnosis order of the plurality of door actuators that are the motor stall diagnosis targets is set in the controller, and the controller sequentially diagnoses the plurality of door actuators in the set order.

5. The stall diagnosis apparatus of claim 1, wherein the plurality of door actuators are classified into high-load actuators requiring a relatively high torque and low-load actuators requiring a relatively low torque in the controller, and a high-load diagnosis current value for determining the motor stall of the high-load actuators and a low-load diagnosis current value for determining the motor stall of the low-load actuators are set in the controller.

6. The stall diagnosis apparatus of claim 5, wherein the controller sequentially performs motor stall diagnosis in a predetermined order on one classification of the door actuators that are classified into high-load and low-load, and changes the diagnosis current value to sequentially perform the motor stall diagnosis on the other classification of the door actuators in a predetermined order.

7. The stall diagnosis apparatus of claim 6, wherein the door actuators classified into high-load comprise a temperature control door actuator and an air volume control door actuator, and the door actuators classified into low-load comprise an indoor/outdoor air door actuator and a dehumidification door actuator.

8. The stall diagnosis apparatus of claim 7, wherein the door actuators classified into low-load further comprise door actuators controlling air discharged into a console or a floor of rear seat of a vehicle.

9. The stall diagnosis apparatus of claim 5, wherein the door actuators classified into high-load comprise a temperature control door actuator and an air volume control door actuator, and the door actuators classified into low-load comprise an indoor/outdoor air door actuator and a dehumidification door actuator.

10. The stall diagnosis apparatus of claim 9, wherein the door actuators classified into low-load further comprise door actuators controlling air discharged into a console or a floor of rear seat of a vehicle.

11. A stall diagnosis apparatus, comprising:
a first motor actuating a first door of a Heating, Ventilation and Air Conditioning (HVAC) system of a vehicle;
a first motor driver connected between a VCC power terminal and the first motor, and driving the first motor by connecting the VCC power terminal to the first motor;
a first switch and a resistor disposed parallel to the first motor driver and the first motor, wherein one terminal of the first switch is connected to the VCC power terminal and one terminal of the resistor is connected to the ground;
a first current sensing circuit including a first input terminal connected between the first motor driver and the first motor and a second input terminal connected between the first switch and the resistor, and outputting a first current signal corresponding to a voltage differential between the first and second input terminals;
a controller, by transmitting a first driving signal to the first motor driver and a second driving signal to the first switch, controlling operation of the first motor and determining whether the first motor is stalled by determining whether a current value of the first current signal outputted from the first current sensing circuit is greater than a first predetermined diagnosis current value;
a second motor actuating a second door of HVAC system;
a second motor driver connected between the VCC power terminal and the second motor, and driving the second motor;
a second switch connected in parallel to the first switch; and
a second current sensing circuit including a third input terminal connected between the second motor driver and the second motor and a further input terminal connected between the second switch and the resistor, and outputting a second current signal corresponding to a voltage differential between the third and fourth input terminals,
wherein the controller, by transmitting a third driving signal to the second motor driver and a fourth driving signal to the second switch, controlling operation of the second motor and determining whether the second motor is stalled by determining whether a current value of the second current signal outputted from the current sensing circuit is greater than a second predetermined diagnosis current value different from the first predetermined diagnosis current value.

\* \* \* \* \*